United States Patent

Yeh et al.

[11] Patent Number: 6,153,483
[45] Date of Patent: Nov. 28, 2000

[54] METHOD FOR MANUFACTURING MOS DEVICE

[75] Inventors: Wen-Kuan Yeh, Chupei; Tony Lin, Kaohsiung Hsien, both of Taiwan

[73] Assignee: United Microelectronics Corp., Taiwan

[21] Appl. No.: 09/193,005

[22] Filed: Nov. 16, 1998

[51] Int. Cl.$^7$ .................................................. H01L 21/336
[52] U.S. Cl. .......................... 438/299; 438/303; 438/306
[58] Field of Search ..................................... 438/299, 301, 438/303, 305, 306, 307, 594, 595, 709, 723, 724, 734, 743, 744

[56] References Cited

U.S. PATENT DOCUMENTS 6,004,851  12/1999  Peng ......................................... 438/301

*Primary Examiner*—Charles Bowers
*Assistant Examiner*—Jack Chen
*Attorney, Agent, or Firm*—Hickman Coleman & Hughes, LLP

[57] ABSTRACT

A method for manufacturing MOS device that utilizes a special shape spacer as a mask in an ion implantation operation to form a graded source/drain region. The special shaped spacer has a thin wall section on the far side away from the gate so that as ions are implanted into the substrate to form a source/drain region, dopants are implanted to various depths. The graded doping profile in the source/drain region not only reduces the severity of short channel effects, but also forms a base for forming an integral junction over the source/drain region in subsequent self-aligned silicide process.

15 Claims, 4 Drawing Sheets

METHOD FOR MANUFACTURING MOS DEVICE

BACKGROUND OF THE INVENTION

1. Field of Invention

The present invention relates to a method for manufacturing integrated circuit (IC). More particularly, the present invention relates to a method for manufacturing metal-oxide-semiconductor (MOS) device.

2. Description of Related Art

As techniques for fabricating semiconductor devices continues to improve, silicon wafer having a larger size and MOS device having a smaller line width are now being manufactured. Consequently, more devices and circuits can be packed inside a single silicon chip and hence the cost of production is lowered considerably. However, the miniaturization of semiconductor devices is accompanied by a host of problems that must be tackled. For example, as line width of a device shrinks, channel length of a MOS device will reduce leading to short channel effects.

Short channel effects are detrimental to the normal operation of a MOS device. As the channel length is shortened, the depletion region around the source/drain of a MOS device will begin to encroach upon the channel region so that the subthreshold current within the channel may increase considerably. Under these circumstances, the MOS device will be in an "ON" or "OFF" state even when no control voltage is applied to the gate terminal of the MOS device. Hence, the intended function of the MOS device is completely lost.

Furthermore, as the length of a channel is reduced, hot electrons can strongly affect the operation of a MOS transistor. Supposing that the source voltage applied to a MOS device remains unchanged, a shorter channel will tend to increase the strength of lateral electric field across the channel. Therefore, some electrons having an energy level higher than that at the thermal equilibrium level, the so-called hot electrons, will be accelerated by the strong electric field to form a large substrate current. The substrate current may interfere with the normal current flowing inside the channel. Occasionally, the substrate current may be large enough to cause the breakdown of MOS device.

FIGS. 1A through 1D are cross-sectional views showing the progression of manufacturing steps according to a conventional method for producing a MOS device whose source/drain regions has a lightly doped drain (LDD) structure.

First, as shown in FIG. 1A, a substrate 100 having an isolation region 102 and a gate 110 thereon is provided. Thereafter, using the isolation region 102 and the gate 110 as a first mask, a first ion implantation 116 is carried out implanting phosphorus ions having a concentration of about $10^{13}/cm^2$ into the substrate 100 to form lightly doped source/drain regions 130. Next, as shown in FIG. 1B, a silicon dioxide layer 120 is formed over the substrate 100 using, for example, a chemical vapor deposition (CVD) method. Thereafter, the silicon dioxide layer 120 is annealed by heating to a temperature of between 900° C. to 1000° C.

Subsequently, as shown in FIG. 1C, an anisotropic etching operation is carried out to form spacers 120a. A dry etching method is used to remove a large portion of the silicon dioxide layer 120 above the substrate 100. Because the silicon dioxide layer 120 on the sidewalls 109 of the gate 110 is particularly thick, a portion of the silicon dioxide layer will still adhere to the sidewalls 109 of the gate 110 after the anisotropic etching operation.

Finally, as shown in FIG. 1D, a second ion implantation 126 is carried out using the spacer-lined gate 110 and the isolation region 102 as a second mask. In the second implantation, phosphorus ions having a concentration of about $10^{15}/cm^2$ are implanted into the substrate 100 to form a heavily doped source/drain region 150 inside the lightly doped source/drain region 130.

However, in the process of manufacturing a MOS device, some problems frequently appear especially when the line width of the MOS device is reduced below 0.25 μm. Normally, a self-aligned silicide (Salicide) process will be carried out to form a metal suicide layer over the source/drain region and the gate for increasing the electrical conductivity there. In the salicide process, for example, metal such as titanium is deposited over the source/drain regions and the gates followed by a rapid heating operation. When the level of integration for transistors increases, the titanium silicide layer above the source/drain region may punch through the junction between the LDD structure and the source/drain region. Hence, the source/drain region may contact the semiconductor substrate directly resulting in failure of transistor devices.

Furthermore, the punch-through margin when ions are implanted into the source/drain region will be closer to the substrate as the level of integration is increased. This can substantially increase the possibility of current leak from a transistor device.

In light of the foregoing, there is a need to improve the method for manufacturing a MOS device.

SUMMARY OF THE INVENTION

Accordingly, the present invention is to provide a graded doping profile in the source/drain regions on each side of the gate terminal. The graded doping profile in the source/drain region not only can reduce the severity of short channel effects, but can also maintain junction integrity at the interface between a silicide layer and the source/drain region.

To achieve these and other advantages and in accordance with the purpose of the invention, as embodied and broadly described herein, the invention provides a method for manufacturing MOS device. The method includes the steps of providing a substrate having an isolation region and a gate thereon, and then forming lightly doped source/drain regions in the substrate on each side of the gate. Thereafter, a thin film is formed over the substrate including the gate, and then an anisotropic etching operation and an isotropic etching operation are carried out in sequence to form spacers on the gate sidewalls. The spacer has a special thin wall section on the far side away from the gate. Subsequently, using the isolation region and the spacer-lined gate as a mask, ions are implanted into the substrate followed by an annealing operation to form a source/drain region having a graded doping profile.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
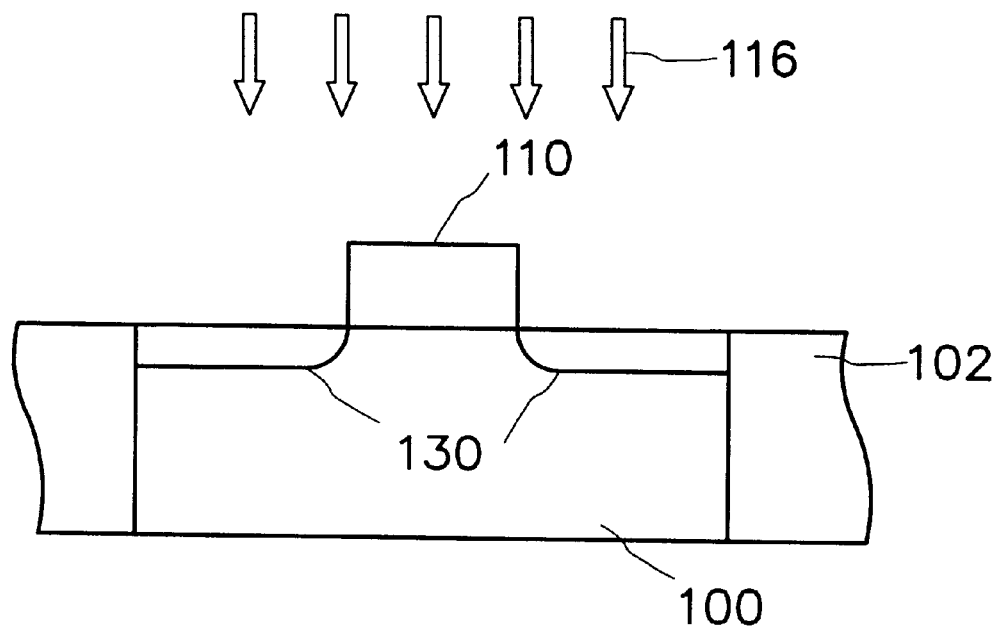
FIGS. 1A through 1D are cross-sectional views showing the progression of manufacturing steps according to a conventional method for producing a MOS device whose source/drain regions has a lightly doped drain (LDD) structure.
Figure 1B:
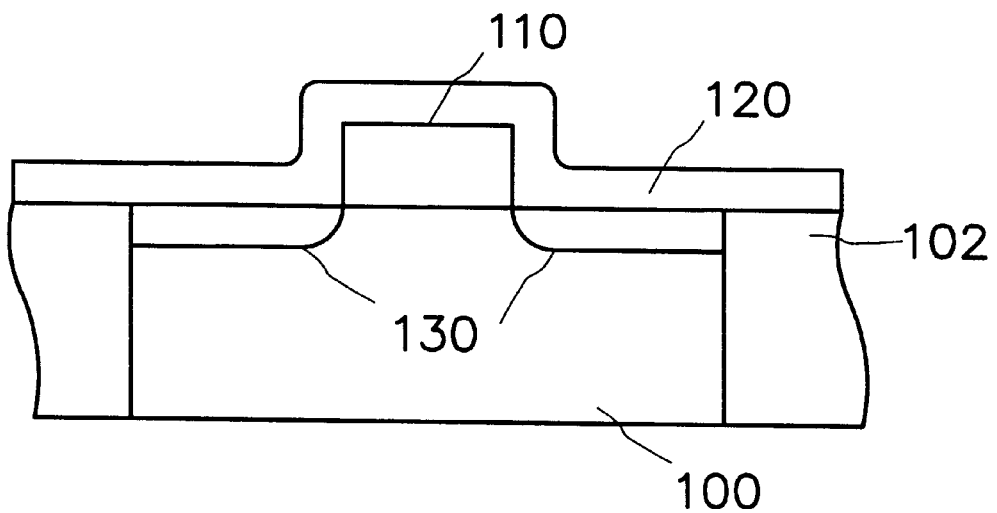
Figure 1C:
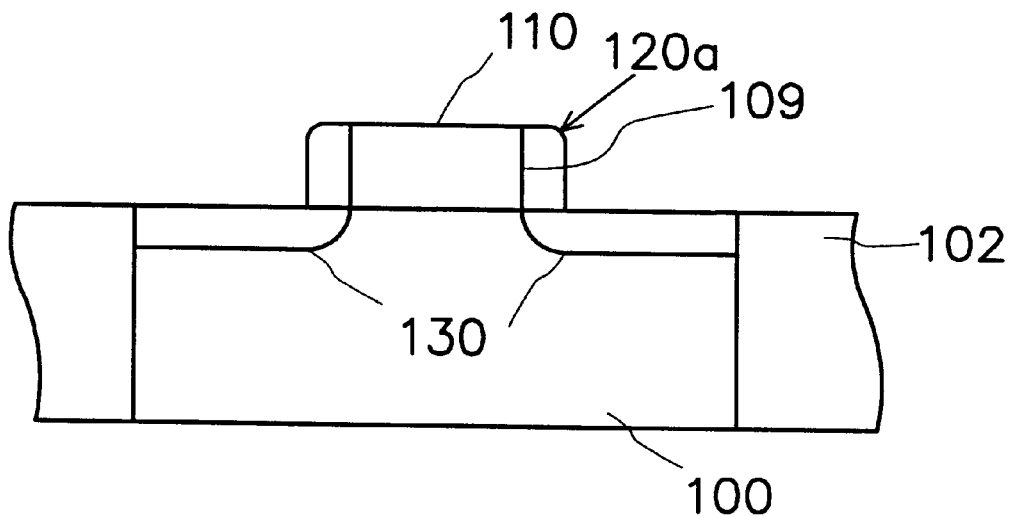
Figure 1D:
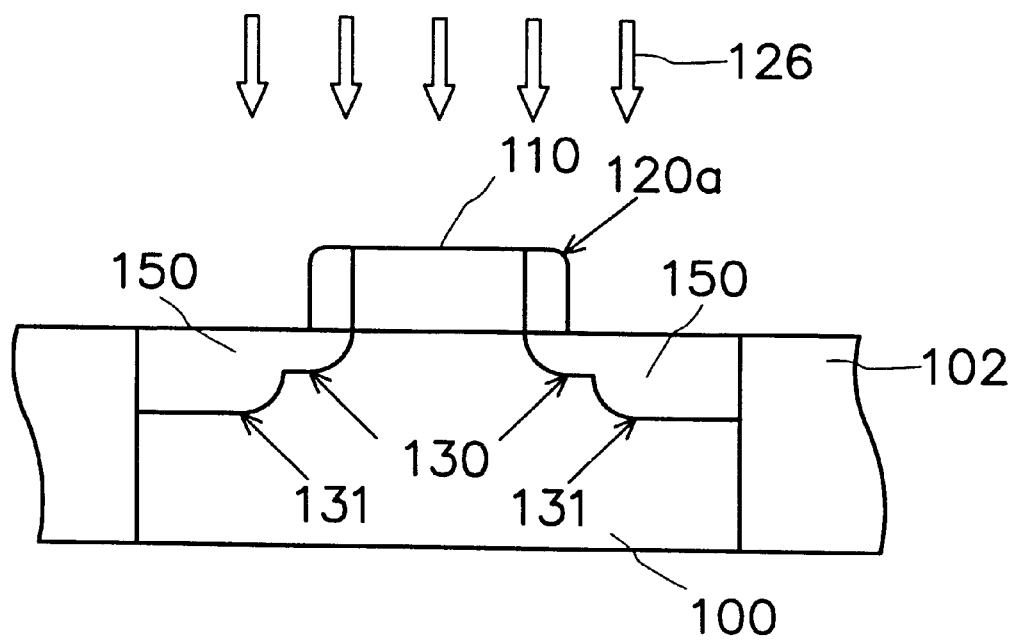

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2E are cross-sectional views showing the progression of manufacturing steps for fabricating a MOS device according to one preferred embodiment of this invention.

Figure 2A:
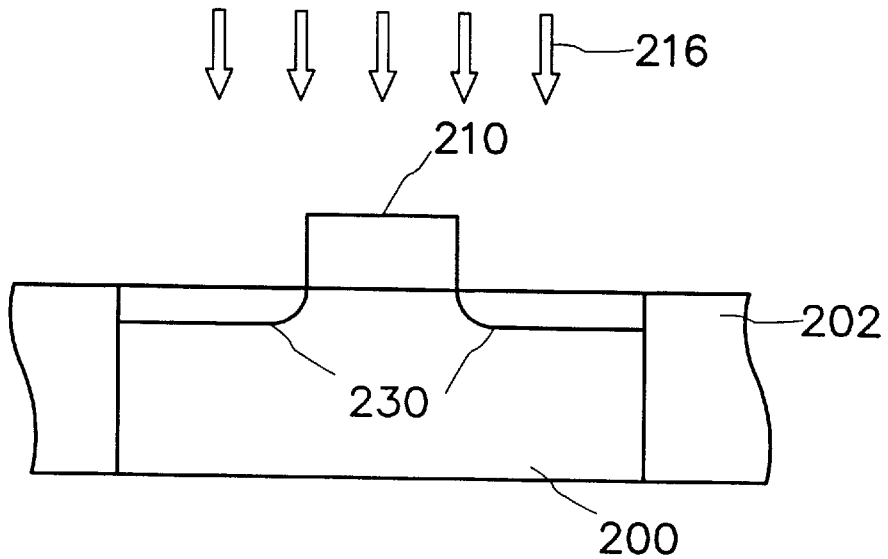
FIGS. 2A through 2E are cross-sectional views showing the progression of manufacturing steps for fabricating a MOS device according to one preferred embodiment of this invention.

First, as shown in FIG. 2A, a substrate 200 having a gate 210 and an isolation region 202 thereon is provided. The isolation region 202 can be a shallow trench isolation (STI) structure or simply a field oxide layer. Thereafter, using the isolation region 202 and the gate 210 as a first mask, a first ion implantation 216 is carried out implanting phosphorus ions having a concentration of about $10^{13}/cm^2$ into the substrate 200 to form lightly doped source/drain regions 230, which is also known as shallow source/drain extensions.

Figure 2B:
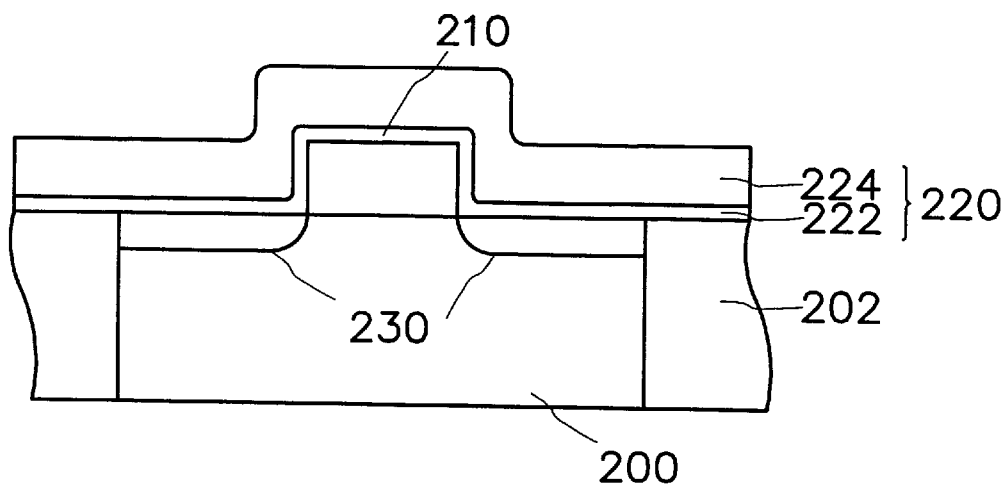

Next, as shown in FIG. 2B, a thin film layer 220 is formed over the substrate 200. The thin film layer 220 can be a composite layer formed, for example, by depositing a thin oxide layer 222 and a silicon nitride layer 224 in sequence.

Figure 2C:
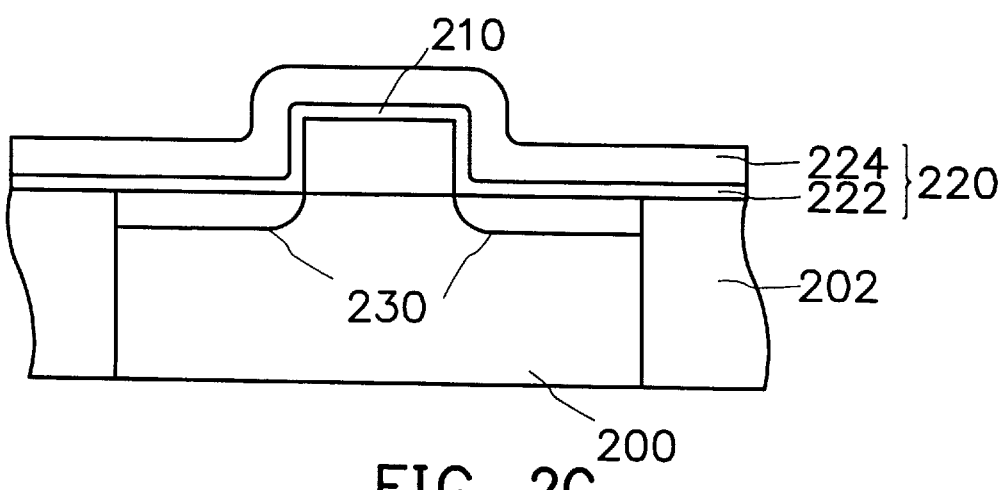

Thereafter, as shown in FIG. 2C, the thin film layer 220 is etched anisotropically in a direction perpendicular to the substrate surface to remove a portion of the thin film layer 220, for example, a portion of the silicon nitride layer 224. The anisotropic etching operation is carried out in a plasma etching machine with carbon tetrafluoride flowing at 35 to 60 sccm, hydrogen sulfide at 5 to 8 sccm, pressure at about 40 mTorr and a power input of around 600 W.

Figure 2D:
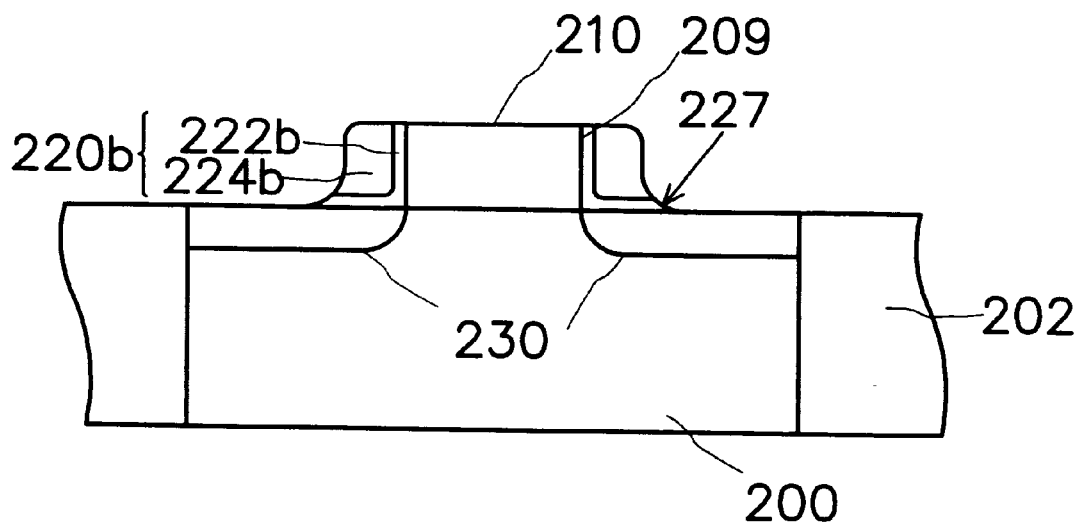

Next, as shown in FIG. 2D, the thin film layer 220 is etched isotropically to remove another portion of the thin film layer 220 until a portion of the substrate 200 is exposed. Eventually, spacers 220b are formed on the sidewalls 209 of the gate 210. The anisotropic etching operation is carried out in a plasma etching machine with carbon tetrafluoride flowing at 15 to 25 sccm, hydrogen sulfide at 40 to 60 sccm, pressure at about 40 mTorr and a power input of around 600W. The two-stage etching operation that involves an anisotropic etching operation followed by an isotropic etching operation creates a special thin wall section 227 at the far end of the spacer 220b away from the gate 210.

Figure 2E:
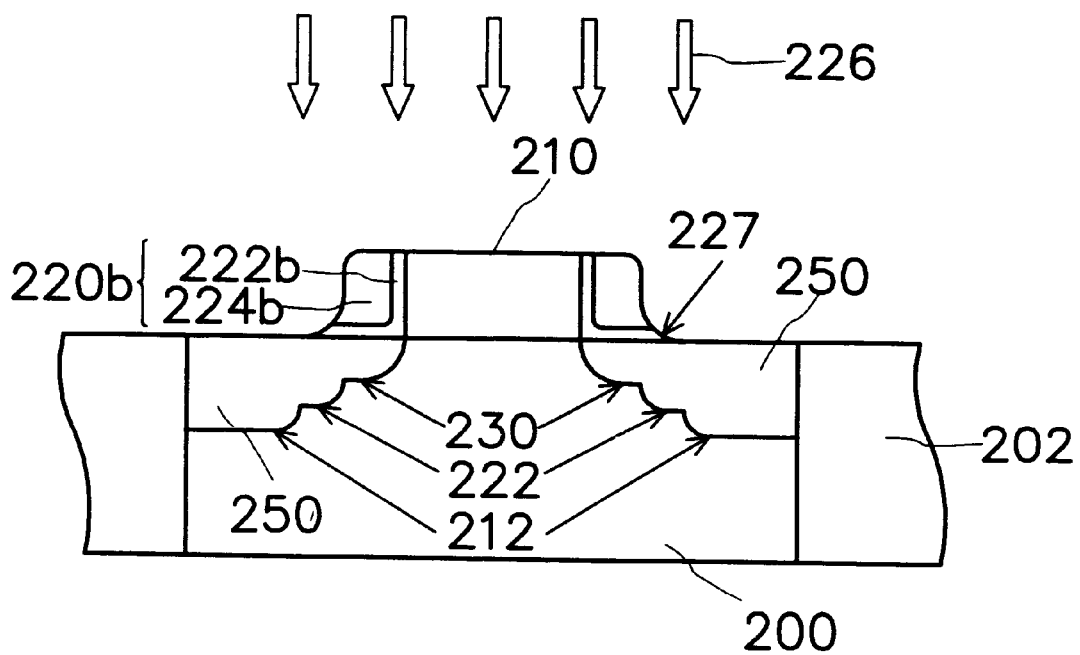

Thereafter, as shown in FIG. 2E, a second ion implantation 226 is carried out using the spacer-lined gate 210 and the isolation region 202 as a second mask. In the second implantation, phosphorus or arsenic ions having a concentration of about $10^{15}/cm^2$ are implanted into the substrate 200, and then the substrate 200 is annealed. Since the spacers 220b have a special thin wall section 227, some of the ions in the second implantation 226 can penetrate through the thin wall section 227 to form a lightly doped region 222. On the other hand, substrate regions not covered by spacers will form heavily doped source/drain regions 212. Consequently, a source/drain region having a graded cross-sectional doping profile that resembles a staircase is formed. In general, the heavily doped region outside the spacer-covered area is called a deep source/drain extension 212, while the lightly doped region underneath the thin wall section 227 is called a moderate source/drain extension 222.

In summary, by carrying out ion implantation twice, a source drain region having a three-tier staircase-like doping profile is obtained. Furthermore, depth and concentration of the shallow and deep source/drain regions can be precisely set by carefully controlling the parameters used in the implantation operation and the annealing process. The graded source/drain region not only permits the formation of a shallow junction to avoid short channel effect and device punchthrough, but also forms a base for forming an integral junction at the interface between the subsequently formed silicide layer and the source/drain region.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing MOS device, comprising the steps of:

providing a substrate that has a gate and an isolation structure thereon and a lightly doped source/drain region already defined;

forming a film silicon nitride layer over the substrate;

carrying out an anisotropic etching operation to remove a portion of the silicon nitride film layer, thereby reducing a thickness of the silicon nitride film layer; and carrying out an isotropic etching operation to remove another portion of the silicon nitride film layer, thereby forming spacers on sidewalls of the gate, wherein each spacer has a wall section that implanted ions can penetrate through a far side away from the gate; and forming a source/drain region having a graded cross-sectional doping profile in the substrate on each side of the gate, wherein the source/drain region comprises a heavily doped region extending under the wall section of the spacer.

2. The method of claim 1, wherein the step of forming the silicon nitride film layer includes depositing an oxide layer over the substrate followed by depositing a silicon nitride layer over the oxide layer.

3. The method of claim 2, wherein the step of performing the anisotropic etching operation includes removing a top portion of the silicon nitride layer to reduce its thickness.

4. The method of claim 2, wherein the step of performing the isotropic etching operation includes removing another portion of the silicon nitride layer and the oxide layer above the gate so that spacers are formed on the sidewalls of the gate.

5. The method of claims 1 or 3, wherein both the anisotropic etching and the isotropic etching of the silicon nitride film layer are carried out using a plasma etching machine.

6. The method of claim 4, wherein the anisotropic etching operation is carried out in a plasma etching machine using carbon tetrafluoride with a flow rate of 35 to 60 sccm, hydrogen sulfide with a flow rate of 5 to 8 sccm, a pressure of about 40 mTorr and a power input of about 600 W.

7. The method of claim 4, wherein the isotropic etching operation is carried out in a plasma etching machine using carbon tetrafluoride with a flow rate of 15 to 25 sccm, hydrogen sulfide with a flow rate of 40 to 60 sccm, a pressure of about 40 mTorr and a power input of about 600 W.

8. The method of claim 1, wherein the graded cross-sectional doping profile includes a three-layer doping profile, wherein the three-layer doping profile has a staircase profile.

9. A method for manufacturing MOS device, comprising the steps of:

providing a substrate that has a gate and an isolation structure thereon;

using the isolation structure and the gate as a first mask, implanting ions into the substrate to form a lightly doped source/drain region;

depositing an oxide layer and then a silicon nitride layer over the gate and the substrate;

carrying out an anisotropic etching operation to remove a portion of the silicon nitride layer so that an overall thickness of the silicon nitride layer is reduced;

carrying out an isotropic etching operation to remove another portion of the silicon nitride layer and the oxide layer above the gate so that a spacer is formed on a sidewall of the gate; and using the isolation structure and the gate with the spacer as a second mask, implanting ions into the substrate to form a source/drain region having a graded cross-sectional doping profile.

10. The method of claim 9, wherein both the anisotropic etching and the isotropic etching of the silicon nitride layer and the oxide layer are carried out using a plasma etching machine.

11. The method of claim 10, wherein the anisotropic etching operation is carried out in a plasma etching machine using carbon tetrafluoride with a flow rate of 35 to 60 sccm, hydrogen sulfide with a flow rate of 5 to 8 sccm, a pressure of about 40 mTorr and a power input of about 600 W.

12. The method of claim 10, wherein the isotropic etching operation is carried out in a plasma etching machine using carbon tetrafluoride with a flow rate of 15 to 25 sccm, hydrogen sulfide with a flow rate of 40 to 60 sccm, a pressure of about 40 mTorr and a power input of about 600 W.

13. The method of claim 9, further including the step of carrying out an annealing operation after the step of implanting ions into the substrate to form the source/drain region.

14. The method of claim 9, wherein the isolation structure includes a shallow trench isolation.

15. The method of claim 9, wherein the graded cross-sectional doping profile includes a three-layer doping profile, wherein the three-layer doping profile has a staircase profile.

* * * * *